United States Patent [19]

Spengler et al.

[11] Patent Number: 4,771,441
[45] Date of Patent: Sep. 13, 1988

[54] SYNCHRONIZING UNIT

[75] Inventors: Werner Spengler, Munich; Johann Kranabetter, Rosenheim, both of Fed. Rep. of Germany

[73] Assignee: Siemens Aktiengesellschaft, Berlin and Munich, Fed. Rep. of Germany

[21] Appl. No.: 897,819

[22] Filed: Aug. 19, 1986

[30] Foreign Application Priority Data

Aug. 19, 1985 [DE] Fed. Rep. of Germany ....... 3529648

[51] Int. Cl.[4] .......................... H04L 7/00; H03K 1/17
[52] U.S. Cl. ...................................... 375/106; 328/63; 307/269
[58] Field of Search ................ 375/106, 110; 328/155, 328/63; 307/269

[56] References Cited

U.S. PATENT DOCUMENTS 3,123,810  3/1964  Strauch, Jr. et al. .
3,537,075 10/1970  Anderson et al. .
3,810,235  5/1974  Hopkins et al. .
4,039,960  8/1977  Clark .
4,380,736  4/1983  Pfaff .
4,719,365  1/1988  Misono .......................... 328/63 X

FOREIGN PATENT DOCUMENTS 1917003 10/1970  Fed. Rep. of Germany .
2224391 11/1973  Fed. Rep. of Germany .
2246590  3/1974  Fed. Rep. of Germany .
2091522  7/1982  United Kingdom .

Primary Examiner—Stephen C. Buczinski
Assistant Examiner—Linda J. Wallace
Attorney, Agent, or Firm—Hill, Van Santen, Steadman & Simpson

[57] ABSTRACT

A synchronizing unit generates synchronized pulse sequences from an external digital signal pulse sequence, with the assistance of an internal work clock, using two serially connected flip-flops for accepting external digital signal pulse sequences and for providing synchronized data and clock pulses corresponding thereto. The clock of the external digital signal pulse sequence has the same clock frequency as the work clock with which the data is to be synchronized, but with an undefined phase relation. For the purpose of synchronizing, during a acquisition state, a switching stage is driven into a first state by the clock of the external digital signal pulse sequence, and a divider is triggered by the output of the switching stage. In a second state of the switching stage, corresponding to a normal operating state, the first switching stage is deactivated and the divider operates continuously.

7 Claims, 2 Drawing Sheets

SYNCHRONIZING UNIT

BACKGROUND OF THE INVENTION

The present invention relates to a synchronizing unit for generating a synchronized pulse sequence from an external signal pulse sequence, with the assistance of an internal work clock sequence.

Synchronizing units have been developed for numerous applications. In general, what is involved is to process an externally supplied signal sequence at the site of a receiver, sYnchronously with an internal work clock sequence, without losing information from the received signal. In a special case, the clock frequency of the external sequence is the same as the frequency of the internal work clock but the two differ from each other in terms of phase.

A special case is when the absolute phase difference between the two clock sequences is not closely limited, and can reach the order of magnitude of a clock cycle, or more. This case frequently occurs in data communications and data processing systems where a central controller provides a central clock, often embedded in the data stream of a message, and peripheral devices need to have their work speed adapted to the frequency of this central clock.

While various means are known for keeping the clock frequency in the individual units constant, or adapting them to the frequency of a reference clock, the phase differences still remain critical. This is due to different transmission times in individual units, and phase delays in transmission paths. For example, in a known data switching network adapted for synchronous and asynchronous modes of operation; means are provided for synchronizing the clocks for synchronous data transmission. A clock generator is arranged at a central location within the data switching network and this clock generator emits clock signals to each subscriber requesting synchronous operations over a separate transmission path, independent of the asynchronous part of the data switching network. These transmission paths have inherent delays and such delays are augmented by individual delay units to a whole multiple of the clock pulse period. In addition, a delay element is inserted in each section of the data switching network which is to be employed by synchronous subscribers, with the delay time of such unit augmenting the delay time of the respective section to a whole multiple of the clock period and shifting, in time, the message at the switching offices and at the subscribers such that it lies in a predetermined phase relationship to the clock.

In such a system, individual compensations must be provided at each receiving station, and such steps are justified only when the overall network is set up for long term operation. In many other applications, however, it is desirable to select and change the locations of peripheral devices without special considerations relating to transit times so as to minimize the difficulty and cost of such installations.

Thus, if individual phase compensations are not suitable for compensating for different transit times over different transmission paths of the individual lengths, then synchronizing units must be provided locally which synchronize transmitted signal sequences, particularly those sequences used in connection with data processing devices.

In this respect there is known a synchronizing circuit having two switching stages using edge-controlled JK flip-flops. Both flip-flops are connected in series, with the outputs of one being connected to the inputs of the other, and they are controlled in common by the same edge of the internal work clock pulses. Signal pulse sequences to be synchronized are supplied to the initialization inputs of the switching stages in a variety of ways through, for example, logic elements. A disadvantage of this type of conventional synchronizing circuit involves the fact that certain limitations must be observed with respect to the duty cycle of the clock, so that the circuits can operate reliably. This is due to the fact that the two serially connected switching stages are each triggered by one and the same clock edge, and the signal status therefor must not change during a critical time period or else an undefined switching state arises. This critical time period lies on both sides of the triggering clock edge, and is dependent upon by the set up and hold times of the bistable switching devices.

BRIEF DESCRIPTION OF THE INVENTION

It is desirable to provide a synchronizing unit which allows fail-safe operation, given an unknown phase relationship of the input pulse sequence with respect to that of the internal work clock, and which also guarantees a reliable operation even under conditions of unfavorable duty cycles of the clock signals.

In the present state of digital circuit technology, a slightly greater circuit complexity does not represent any significant disadvantage, in view of the relatively low cost of integrated circuits. With apparatus according to the present invention, a specific region is clearly defined on both sides of the controlling clock edges of a clock pulse sequence, in which a embedded in the received signal pulse sequence as a forbidden region in which an accidentally occurring clock edge of the internal work clock cannot take effect. In other words, measures are taken to provide for a stable signal status at the initialization input of the flip-flop which produces a synchronized signal pulse sequence in every case, even during the set up time, and during the subsequent hold time of such circuit. This is achieved by means of utilizing the transit time in the switching stage and in the frequency divider. An edge of the higher frequency internal clock signal can be selected only when the switching stage has been previously switched over by a clock edge of a clock signal allocated to the signal pulse sequence.

The solution of the present invention is especially advantageous since many applications already require the provision of an internal clock having a multiple of the repetition rate of the received signal pulse sequences. This fact allows the flexibility of the synchronizing unit to be achieved without great additional expense or circuit complexity, and there is no need for a limiting the acceptable amount of the absolute phase difference between the clock of the received signal and the internal work clock.

Which one of the particular clock edges of the internal higher frequency clock signal is selected for the synchronizing process is of subordinate significance. Since the internal clock signal is always divided down by means of a frequency divider the starting edge of the frequency division can always be selected to be best adapted to the phase difference which actually occurs in a particular application.

In a development of the present invention, it is possible to construct the switching stage and the frequency divider in a relatively simple way, by using only two flip-flops, when the frequency of the internal clock signal is exactly twice that of the synchronized clock signal.

In another development of the invention, a further switching stage is provided, controlled by a status signal, to assume one of two switch modes which define a acquisition state or a normal operating state of the synchronizing unit. By this means, in response to the state of this further switching stage, the first switching stage can be set only during the acquisition state; in the normal operating condition, the flip-flop forming the frequency divider is switched only by the internal clock signal. Thus, the synchronizing unit first always assumes a acquisition state for achieving synchronization, and then in the normal operating condition is controlled only by the higher frequency internal clock signal. Clock pulses allocated to the received signal pulse sequence are evaluated only in the acquisition state, in order to create the synchronized condition. Therefore, it is only of subordinate significance if the detection of the phase relationship may even be missed during one of the subsequent clock cycles. Even in this case the current status condition is maintained so that no undefined states can occur.

A development of the invention is particularly directed to a case in which successive clock pulses of the higher frequency internal clock signal can fall in an arbitrary relationship, relative to the clock embedded in the received signal pulse sequence, and in the acquisition state, the synchronizing unit could set itself arbitrarily to one or the other of two clock edges of the higher frequency internal clock signal. Since swinging of the synchronizing unit in a boundary case would be disadvantageous during synchronous operation, two operating states are defined. The synchronizing is carried out in the acquisition state and the current phase difference (during the transition from the acquisition state into the normal operating condition) is then used as a constant value to form the basis for synchronous operation. This can be implemented by means of a flip-flop employed as a frequency divider. Once it has been set, it resets itself by feedback in synchronism with the synchronized output clock signal.

BRIEF DESCRIPTION OF THE DRAWINGS

Reference will now be made to the accompanying drawings in which.

DESCRIPTION OF THE PREFERRED EMBODIMENT

Figure 1:
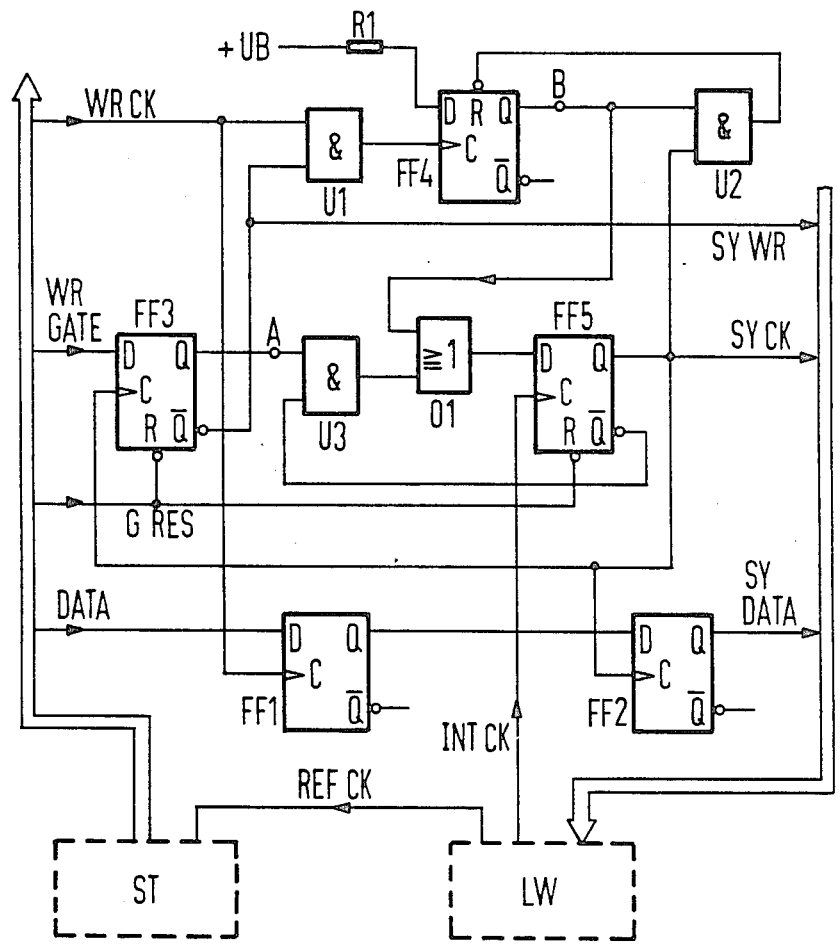
FIG. 1 is a schematic circuit diagram of an illustrative embodiment of the present invention.

The apparatus of FIG. 1 will be described in connection with a magnetic disk file. In such a device, the data is recorded with a frequency which is proportional to the rotational speed of the storage disks of the drive. A disk LW is illustrated merely schematically in FIG. 1, since a conventional unit may be employed, and its construction forms no part of the present invention. It produces a signal INT CK, corresponding to the current speed of operation of the disk drive, along with other data and control signals. It is assumed that the rate of the internal clock signal INT CK corresponds to twice the rate of the bit clock, in order to achieve an optimal pulse duty factor. This internal clock signal is divided down in frequency to a clock signal which corresponds to the bit frequency, and then is transmitted from the disk drive LW as a reference clock REF CK to a storage controller device ST. The controller ST connects the disk LW to its surroundings, such as an electronic system having a data processing function, or the like. For example, the controller accepts data from an external source, converts such data into serial NRZ write data, and together with the reference clock REF CK which serves as the write clock WR CK, transmits such data to the disk LW. Bus connections between LW and ST, and between these units and external devices are shown diagramatically in FIG. 1. Since such disk controllers are well known, the controller ST, will not be described in detail. However, the apparatus for developing synchronized clock signals in connection with data transfers to (or from) the disk LW will be described.

The frequency of the write clock signal WR CK and the reference clock signal REF CK referred to above are identical. However, a phase shift of unknown size occurs, due to the delay times in transmission in both directions between the external data devices and the controller ST. Given current recording and data transmission rates, the sum of these delayed times can reach the order of magnitude of a bit period, i.e. a period of the bit frequency, and it is therefor not possible without some adjustment to receive the write data to be written DATA with the device-internal reference clock REF CK, and to synchronize them with the internal clocks of the drive LW.

It should be noted that internal clocks having a multiple of the frequency of the reference clock are normally available, and are required for data coding. In the case of the apparatus of FIG. 1, the multiple is assumed to be twice the clock frequency. The apparatus of FIG. 1 provides for the synchronization. It incorporates two series connected D-type flip-flops FF1 and FF2. The first is clocked by the positive edge of the write clock signal WR CK and accepts, at its D input, the serial-bit data to be written DATA, which is supplied from the controller ST. The Q output of the flip-flop FF1 is connected to the D input of the second D-type flip-flop FF2, which has its clock input connected to a source of a synchronous bit clock SY CK, the origin of which is explained hereinafter. The flip-flops FF1 and FF2 function as intermediate storage devices for the data, which is then supplied to the disk LW, synchronized with write data pulses SY DATA.

The synchronizing unit of FIG. 1 has two states, which are determined by two states, which the operating states of a third D-type flip-flop FF3, referred to as a status flip-flop. The flip-flop FF3 has its D input connected to receive a write control signal WR GATE, produced by the controller ST and which defines, when high, a write state, and when low, a acquisition state of the synchronizing unit. The write clock signal WR CK is also supplied to an input of an AND gate U1 which has its second input connected to the Q' output of flip-flop FF3. The output of the AND gate U1 is connected to the clock input of a further D-type flip-flop FF4. The D input of the flip-flop FF4 is connected to a positive operating voltage UB through a resistor R1 and is therefore always in its high data state. An AND gate U2 has one input connected to the Q output of the flip-flop FF4, and supplies its output to a reset input of the flip-flop FF4. The Q output of the flip-flop FF4 is also connected through an OR gate 01 to the D input of a further D-type flip-flop FF5. The flip-flop FF5 has its clock input connected to receive the internal clock signal INT CK, which has twice the bit frequency, and is generated by the disk LW. The synchronized clock signal SY CK is produced at the Q output of the flip-flop FF5.

The Q' output of the flip-flop FF5 is connected to an input of an AND gate U3, the second input of which is connected to the Q output of the flip-flop FF3. The output of the AND gate U3 is connected to a second input of the OR gate 01.

The reset inputs of the flip-flops FF3 and FF5 are connected in common to a control line from the controller ST to receive a general reset signal G RES when first turned on, thus placing the synchronizing unit in a defined initial condition.

Figure 2:
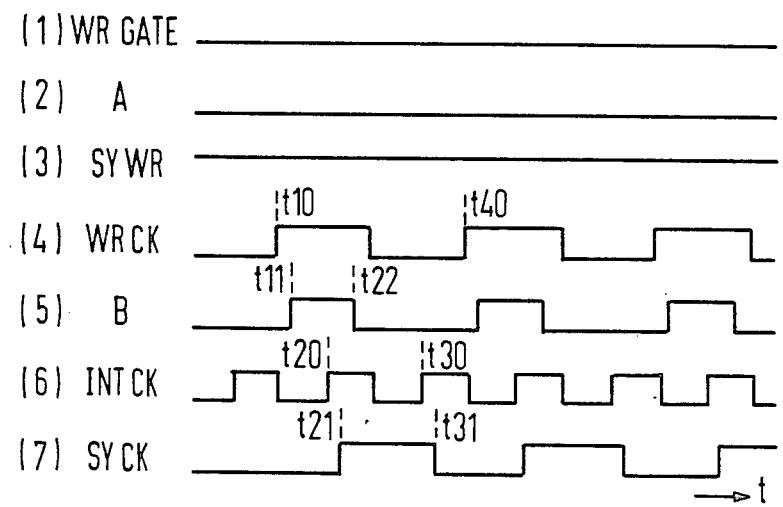
FIG. 2 is a series of pulse diagrams, relative to time, for illustrating operational sequences during the acquisition state of the synchronizing unit, in which an internal work clock is synchronized with an external work clock.
Figure 3:
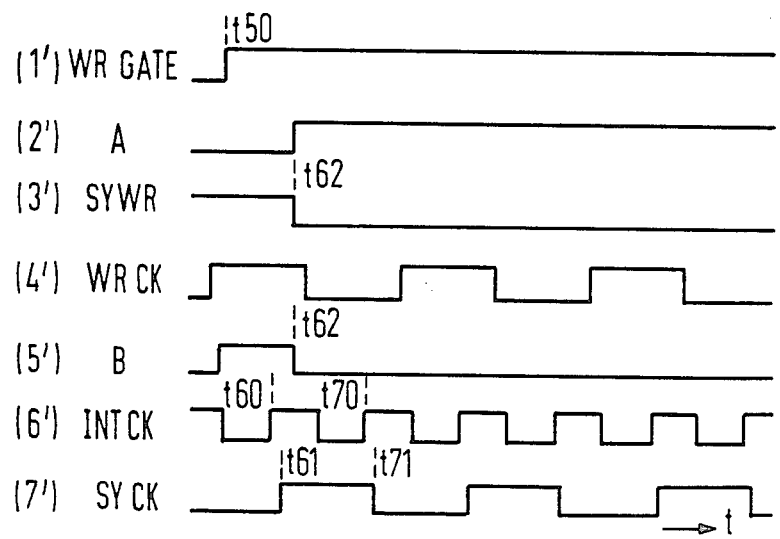
FIG. 3 is a series of pulse diagrams, relative to time, of signals occurring in the normal operation state of the apparatus of FIG. 1.

The operating sequence of the apparatus of FIG. 1 will now be described with reference to the diagrams of FIGS. 2 and 3. The pulse diagrams of FIG. 2 are associated with the acquisition state, which is defined by the low level of the write control signal WR GATE. In the acquisition state, the output at terminal A from the Q output of the flip-flop FF3 is low, and the AND gate U3 is inhibited. The Q' output of the flip-flop FF3 is high during this time and defines the synchronized write signal SY WR. Synchronized writing is inactive as long as the SY WR signal is high.

When a write clock signal WR CK appears, it is passed by the AND gate U1 to the clock input of the flip-flop FF4. The WR CK signal is shown in line 4 of FIG. 2, with a positive edge at time t10, which is effective to set the D-flip-flop FF4. The output at terminal B from the flip-flop FF4 is delayed by the switching time of the flip-flop and the AND gate U1 and achieves a high level at time t11, as shown in line 5 of FIG. 2. This output is supplied through the OR gate 01 to the D input of the flip-flop FF5, which, accordingly changes state at the appearance of the next positive edge of the internal clock signal INT CK, which occurs at time t20, as shown in line 6 of FIG. 2. The SY CK output of flip-flop FF5 is delayed by the transit time of this flip-flop and occurs at time t21, as shown in line 7 of FIG. 2. This signal is passed by the AND gate U2 in order to reset the flip-flop FF4 at time t22, and causes the B signal to go low. The B signal is applied through the OR gate 01 to the flip-flop FF5 which is again driven with the positive edge of the internal clock signal INT CK, switching at time t30. The trailing edge of the synchronized clock signal SY CK appears at time t31, as shown in line 37 of FIG. 2.

As long as the write control signal WR GATE does not change its state, the above sequence of operations continues. Thus, the flip-flop FF4 becomes set again at time t40 with the next positive edge of the write clock signal WR CK, etc. As shown by the sequences in FIG. 2, the individual transit times of the components of the synchronizing unit assume a significant function. This is shown in exaggerated fashion in FIG. 2, and the individual times indicated in FIG. 2 as t10-t31 represent a composite of delay times. For example, the interval between times t10 and t11 is the sum of the transit times in the first AND gate U1 and in the D-flip-flop FF4.

Due to the transit time conditions, there is minimum time spacing between the appearance of a positive edge of the write clock signal WR CK, and a positive edge of the internal clock signal INT CK. This means that the spacing between times t10 and t21 must not fall below a defined minimum value, if the positive edge of the synchronized clock signal SY CK appearing at time t21 is to take effect. This is because the setup and hold times of the flip-flops FF1 and FF2 must be observed, so that no undefined states arise. It is also necessary that the positive and negative edges of the synchronized clock signal SY CK appear properly at times t21 and t31, etc.

The normal operating state of the circuit will now be described in connection with FIG. 3. Line 1 of FIG. 3 shows that the static write control signal WR GATE assumes a high level at time t50, at an arbitrary time. The state flip-flop FF3 is then initialized and switches over at the appearance of the next positive edge of the synchronized clock signal SY CK, as shown in line 2 of FIG. 2. Line 6 of FIG. 3 shows that the transition from the acquisition state into the normal operating state is triggered at time t60, by the appearance of the next positive edge of the internal clock signal INT CK, which follows time t50. The flip-flop FF5 is thus set at time t60 and the synchronized clock signal SY CK changes its level at time t61. This results in the resetting of the flip-flop FF4 at time t62 and the state flip-flop FF3 is set at roughly the same time.

With the change in state of the state flip-flop FF3, the AND gate U1 is inhibited so that subsequent pulses from the write clock signal WR CK are not passed to the flip-flop FF4, and the flip-flop is instead held its reset condition. The third AND gate U3, connected to the Q output of the flip-flop FF3 is now enabled as shown in line 2 of FIG. 3. This effects a reseting of the flip-flop FF5, by passing a signal from its Q' output, to its D input through the AND gate U3 and the OR gate 01. The flip-flop FF5 then switches at the occurrence of the next internal clock signal INT CK.

The direct coupling of the synchronizing unit to the internal clock signal INT CK in the normal operating state significantly contributes to the termination of the operating mode without ambiguity In the acquisition state, it is not determined which of the two positive edges of the internal clock signal INT CK (which appear during a period of the write clock signal WR CK) will be effective for triggering the synchronized clock signal SY CK. It may occur that the phase relationships between the internal clock signal INT CK and the write clock signal WR CK are such that the two edges are alternately selected in the boundary case. This is without consequence in the acquisition state. In the normal operating state however, such a case can no longer occur because of the feedback of the flip-flop FF5. Accordingly, the data which is transmitted together with a clock signal having an undefined phase relationship with respect to a constant frequency internal work clock of a receiving device, is synchronized by the apparatus of FIG. 1, with the assistance of a clock signal having a frequency which is a multiple of the constant frequency of the work clock and which is in a constant phase relationship with the work clock. This results in the realization of the principal condition, namely, that the selected edge of the basic clock rate must always exhibit a predetermined chronological spacing relative to the closest edge of the controlling clock, such as the write clock signal WR CK in the described embodiment. Thus, a forbidden region is defined in the region of the controlling edge of this clock, and is realized with the assistance of the transit times of the components of the synchronizing unit. An edge of the basic clock which accidentally occurs within this region due to an undefined phase shift cannot take effect.

This forbidden region is broader than required by the processing and switching times of the two flip-flops FF1 and FF2, which receive the data signals DATA and which produce the synchronized data signals SY DATA. Even with an unknown phase relation, it cannot occur that the signal state at the data output of the flip-flop FF2 changes within its specific initialization time which precedes the controlling edge of the internal synchronized clock signal SY CK.

It is particularly significant that the circuit transit times are essential for the correct functioning of the apparatus of FIG. 1. In integrated circuits, however, such transit times can vary greatly with individual units. However, this difficulty can be eliminated in an extremely elegant way using the proporty of the present invention in which the function-defining flip-flops for the transit times (FF1 and FF4) are utilized for the detection of the forbidden region and may be realized with trigger circuits in the form of a single integrated circuit module. Alternatively, a plurality of D-flip-flops can be used employing discreet components.

By the above description, it is apparent that the present invention furnishes a simple and efficient method of achieving the advantages described above. It is apparent that various modifications and additions may be made in the apparatus of the present invention, which is intended to be defined and oecured by the appended claims.

What is claimed is:

1. A synchronizing unit for generating a synchronized pulse sequence from an externally supplied, digital signal pulse sequence, said external pulse sequence being in synchronism with an external clock signal, with the assistance of an internal work clock having a frequency which is the same as the bit frequency of said external digital signal pulse sequence but with an undefined phase relationship therewith, comprising first and second serially connected flip-flops interconnected to receive said external digital signal pulse sequence and to provide an output corresponding to data pulses synchronized with said internal work clock, means for controlling said first flip-flop with said external clock signal, whereby said first flip-flop intermediately stores the digital signal pulse sequence, means for controlling operation of said second flip-flop with said internal work clock, whereby said second flip-flop produces the synchronized pulse sequence, a first switching stage adapted to receive and store said external clock signal and for producing an output signal in response thereto, and a a frequency divider connected to receive the output of said first switching stage for dividing the pulse repetition rate of an internal clock signal having a frequency which is a multiple of said internal work clock, whereby said internal clock signal is reduced in frequency to produce synchronized clock pulses at the frequency of said internal work clock, and means for resetting said first switching stage in response to said synchronized clock pulses.

2. Apparatus according to claim 1, wherein said first switching stage and said frequency divider both comprise flip-flops, and wherein the frequency of said internal clock signal is twice that of said synchronized clock pulses.

3. Apparatus according to claim 2, wherein said flip-flop forming said switching stage comprises an initialization input and a reset input, means connecting said initialization input to a constant voltage level, an AND gate having its output connected to said reset input, said AND gate having its inputs connected respectively to the output of said first switching stage and to said synchronized clock signal.

4. Apparatus according to claim 2, including a second switching stage, means for setting said further switching stage in accordance with an externally supplied state signal, whereby said second switching stage can assume one of two switch states which respectively define a acquisition state or a normal state of the synchronizing unit, means connected with an output of said second switching stage for controlling said first switching stage to allow it to be set only during said acquisition state, and means connected with an output of said second switching stage for controlling operation of said frequency divider during said normal operating state.

5. Apparatus according to claim 4, wherein said second switching stage is a state flip-flop having an initialization input connected to receive a state signal and a clock input connected to receive said.synchronized clock pulses, and a first AND gate, the inputs of said first AND gate being connected respectively to an output of said state flip-flop which is active in said acquisition state and to the clock of said external signal pulse sequence, and means for connecting the output of said first AND gate to a clock input of said first switching stage.

6. Apparatus according to claim 5, including a second AND gate having inputs connected to receive respectively an output signal of said state flip-flop which is active in the normal operating mode and said synchronized clock pulses, and having its output connected through an OR gate to an input of said frequency divider, said OR gate having a second input connected to receive an output signal from said first switching stage.

7. Apparatus according to claim 6, wherein said state flip-flop and the flip-flop forming said frequency divider each have a reset input, and means for connecting an external reset signal to said reset inputs for defining a reset condition during an initial operation of said synchronizing unit.

* * * * *